United States Patent
Izuru et al.

(10) Patent No.: US 7,199,600 B2
(45) Date of Patent: Apr. 3, 2007

(54) SEMICONDUCTOR DEVICE TESTING METHOD AND TESTING EQUIPMENT

(75) Inventors: Hitoshi Izuru, Kawasaki (JP); Kazuhiro Tashiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 115 days.

(21) Appl. No.: 11/078,352

(22) Filed: Mar. 14, 2005

(65) Prior Publication Data
US 2006/0061379 A1 Mar. 23, 2006

(30) Foreign Application Priority Data
Sep. 17, 2004 (JP) ............... 2004-270680

(51) Int. Cl.
*G01R 31/26* (2006.01)
(52) U.S. Cl. .................................. 324/765
(58) Field of Classification Search ............. None
See application file for complete search history.

(56) References Cited

U.S. PATENT DOCUMENTS 5,760,599 A * 6/1998 Ehiro .................. 324/765

6,246,248 B1 * 6/2001 Yamagishi ............. 324/763

FOREIGN PATENT DOCUMENTS

| JP | 7-5231 | 1/1995 |
|---|---|---|
| JP | 7-174816 | 7/1995 |
| JP | 11-142471 | 5/1999 |
| JP | 2000-174081 | 6/2000 |

* cited by examiner

*Primary Examiner*—Ha Tran Nguyen
*Assistant Examiner*—Trung Q. Nguyen
(74) *Attorney, Agent, or Firm*—Armstrong, Kratz, Quintos, Hanson & Brooks, LLP

(57) ABSTRACT

A burn-in testing method to perform tests with a semiconductor device operated in an atmosphere at a prescribed temperature characterized in that operation instruction signals instructing an operation of the semiconductor device are repeatedly supplied while supplying power to the semiconductor device, and increases and decreases in a power supply current corresponding to the operation instruction signals are counted.

8 Claims, 9 Drawing Sheets

CONFIGURATION OF SEMICONDUCTOR DEVICE BURN-IN TESTING EQUIPMENT

SEMICONDUCTOR DEVICE TESTING METHOD AND TESTING EQUIPMENT

CROSS-REFERENCE TO RELATED APPLICATIONS

This application is based upon and claims the benefit of priority from the prior Japanese Patent Application No. 2004-270680, filed on Sep. 17, 2004, the entire contents of which are incorporated herein by reference.

BACKGROUND OF THE INVENTION

1. Field of the Invention

This invention relates to a semiconductor device testing method and testing equipment, and in particular relates to an effective testing method and testing equipment for special semiconductor devices which do not operate in the power supply conducting state.

2. Description of the Related Art

Tests conducted in order to exclude semiconductor devices which undergo infant mortality failure are called burn-in tests.

FIG. 1 shows general changes in the failure rate of semiconductor devices. The horizontal axis plots the operating time, and the vertical axis shows the failure rate. FIG. 1 is generally called the "bathtub curve"; in the infant mortality period T1 during which the operating time is short, the failure rate is high, but when the infant mortality period T1 has passed the failure rate stabilizes at a low level, with failures occurring only randomly, in what is called the random failure period T2. Finally, as the limit of the normal operating life is approached, the failure rate increases; this period is called the wear-out period T3.

Thus when a semiconductor device operates past the infant mortality period T1, the failure rate declines greatly; hence at time of shipment, the semiconductor device is inserted into a thermostatic chamber controlled at an elevated temperature and current is passed to perform accelerated testing and promote infant mortality failures, and those semiconductor devices which may fail in the infant mortality period T1 are excluded. This is called a burn-in test. Such burn-in tests are described in for example Japanese Patent Laid-open No. 11-142471 and Japanese Patent Laid-open No. 7-5231.

In the burn-in testing method described in Japanese Patent Laid-open No. 11-142471, a power supply voltage and input test pattern are supplied to the CMOS type integrated circuit, inserted into a thermostatic chamber, which is to be tested; failure is detected according to whether the stationary power supply current exceeds a prescribed threshold while the device being tested is in a stable state. In Japanese Patent Laid-open No. 7-5231, a burn-in testing method is described for devices with special structures, such as SOI (Silicon On Insulator) integrated circuits.

In the burn-in testing method described in Japanese Patent Laid-open No. 11-142471, an input test pattern corresponding to the device for testing must be generated, resulting in increased costs. Hence in the case of semiconductor devices for specific applications and semiconductor devices having a variety of functions, the device for testing is inserted into a thermostatic chamber, the power supply voltage alone is applied, and only the change in power supply current is monitored. By applying the power supply voltage in an elevated temperature state, some degree of stress can be applied to the semiconductor device; if the power supply current during accelerated testing remains at a prescribed level the device passes, and if the prescribed level is exceeded the device is judged to be defective owing to the occurrence of some failure. That is, this method cannot reproduce the normal operating state using an input test pattern, and so cannot be described as a complete testing method.

In the case of memory semiconductor devices, writing and reading are repeated while changing the address to perform burn-in testing. In the case of a memory device, data writing and reading operations are verified.

Among semiconductor devices, image sensors having image-capture function, fingerprint sensors and similar must guarantee a prescribed number of operations during use; in the normal state such devices perform no operations, but perform prescribed internal operations in response to an operation command, and thereafter return to the normal state. Hence such semiconductor devices do not have complex logic functions such as those of semiconductor devices for specific applications, nor are writing and reading performed, as in the case of memory devices. For this reason, there have not yet been any proposals of burn-in testing methods appropriate to such semiconductor devices. If a power supply voltage were simply applied to perform accelerated testing, as in the case of the above-described semiconductor devices for special applications, the burn-in tests would be insufficient; and so proposals of appropriate burn-in testing methods have been awaited.

Hence an object of this invention is to provide a method and device to perform burn-in testing appropriate to semiconductor devices such as image sensors and fingerprint sensors.

This invention comprises accelerated testing at normal temperatures as well as at elevated temperatures.

SUMMARY OF THE INVENTION

In order to attain the above object, one aspect of this invention is a burn-in testing method to perform tests with a semiconductor device operated in an atmosphere at a prescribed temperature, and is characterized in that operation instruction signals instructing an operation of the semiconductor device are repeatedly supplied while supplying power to the semiconductor device, and increases and decreases in a power supply current corresponding to the operation instruction signals are counted.

In a preferred embodiment of this aspect, the semiconductor device comprises either an image sensor which executes an image capture operation in response to an operation instruction signal, or a fingerprint sensor which executes a fingerprint shape recognition operation in response to an operation instruction signal, and also comprises semiconductor devices which in the state of power being supplied are in a standby state without performing the expected operation, but in response to an instruction operation enter an operating state and execute the expected operation.

A preferred embodiment of the above aspect is characterized in that, when the number of increases or decreases of the power supply current to the operation instruction signals reaches a first number, the device is judged to have passed the test, and if the first number is not reached, the device is judged to have failed. Still more preferably, an embodiment is characterized in that supply of operation instruction signals is performed repeatedly until a second number, which is greater than the first number, is reached. A semiconductor device for which the number of increases and decreases in the power supply current corresponding to operation instruction signals has reached the first number can be judged to have passed the infant mortality period and to be capable of operation. Therefore, the first number is set to a number by which it can be judged that the device can operate over the infant mortality period. In order to save a device in which there has been no increase or decrease in power supply current accidentally, the number of operation instruction signals supplied is set to a number larger than the first number. By this means, burn-in tests can be prevented from requiring an unnecessarily amount of time.

According to these aspects of the invention, operation instruction signals are repeatedly supplied to a semiconductor device while supplying a power supply, the number of increases and decreases in the power supply current corresponding to operation instruction signals is counted, and a device is judged as either passing and having passed the infant mortality period, or not passing. Hence defective devices can be eliminated appropriately through burn-in tests.

DESCRIPTION OF THE PREFERRED EMBODIMENTS

Below, embodiments of the invention are explained using the drawings. However, the technical scope of the invention is not limited to these embodiments, but extends to the inventions described in the scope of claims and to inventions equivalent thereto.

Figure 1:
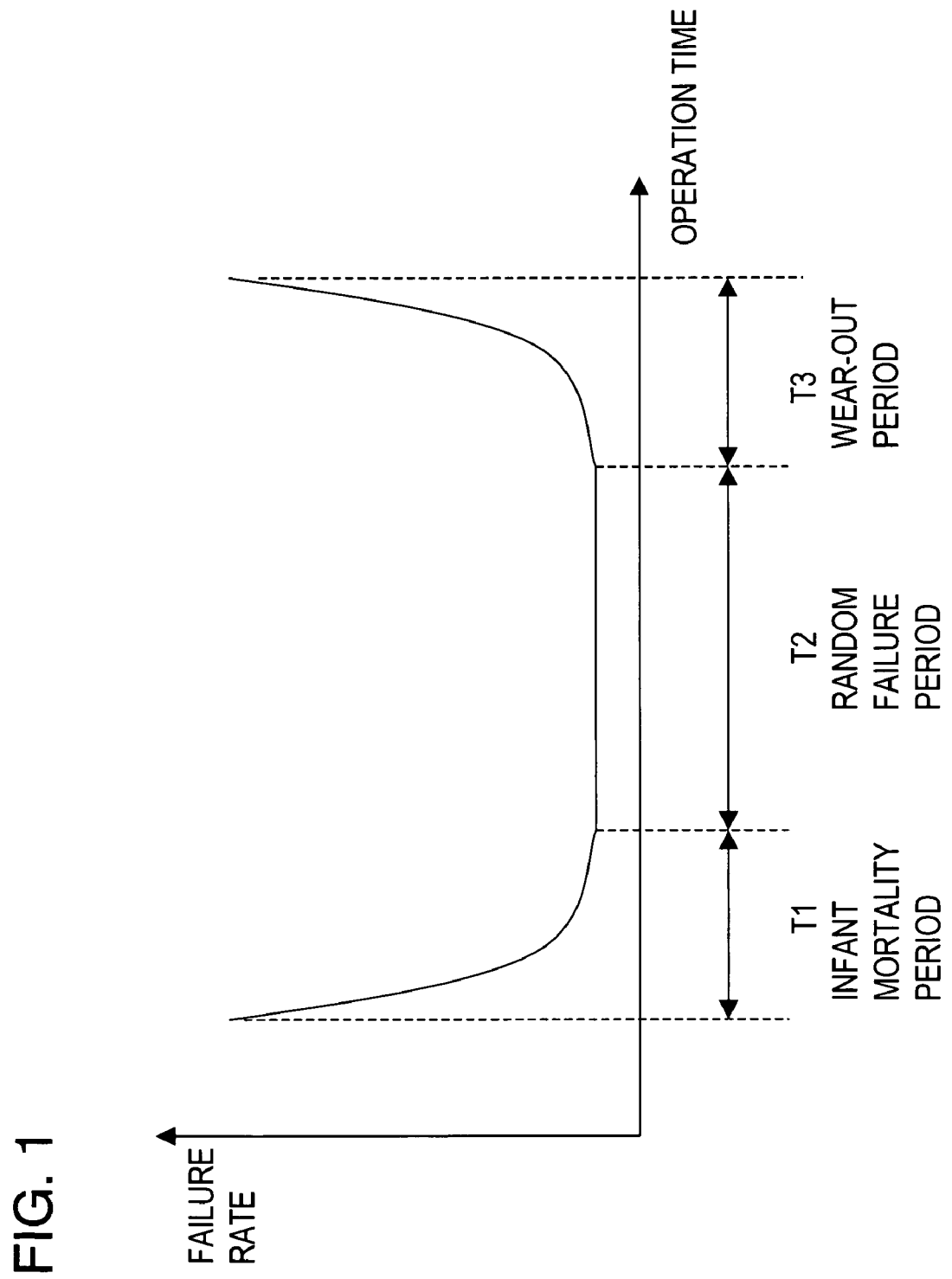
FIG. 1 shows the general change in failure rate of semiconductor devices.
Figure 2:
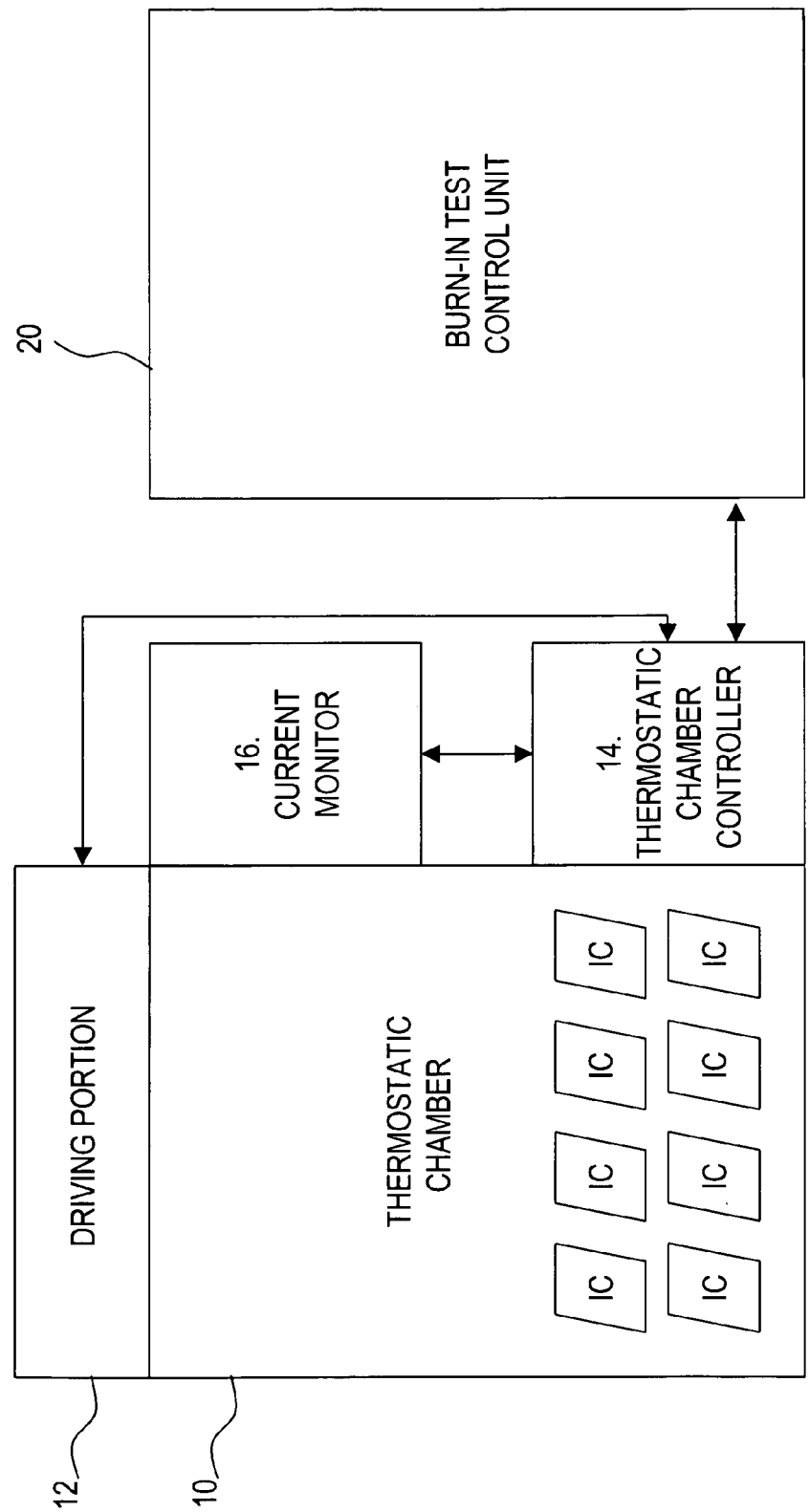
FIG. 2 shows the configuration of semiconductor device burn-in testing equipment in one embodiment.

FIG. 2 shows the configuration of semiconductor device burn-in testing equipment in one embodiment. The thermostatic chamber 10 has a thermostatic chamber control portion 14 which holds the interior of the thermostatic chamber in a desired temperature state. A plurality of semiconductor devices IC which are the devices for testing are inserted into the thermostatic chamber 10, and power is supplied by a driving portion 12. The driving portion 12 repeatedly supplies an operation instruction signal to the semiconductor devices in response to an instruction from the thermostatic chamber control portion 14. The current monitoring portion 16 monitors increases and decreases in the power supply current associated with operation instruction signals, and detects increases and decreases in the power supply current.

The burn-in testing control unit 20 controls the burn-in testing of semiconductor devices inserted into the thermostatic chamber 10. Specifically, an upper limit (the second number) for the number of times an operation instruction signal is supplied, and a number of increases and decreases in the power supply current for the device to be judged to pass (the first number), are set in the burn-in testing control unit 20. Also, threshold values to judge power supply current increases and decreases are set. Instructions are then issued to the thermostatic chamber control portion 14 for burn-in tests corresponding to these settings. For example, if 1000 times is set as the first number, and 1100 times is set as the second number, then the burn-in testing control unit 20 causes the driving portion 12 to repeatedly supply operation instruction signals to the devices via the thermostatic chamber control portion 14, counts the number of increases and decreases in the power supply current detected by the current monitoring portion 16, and judges semiconductor devices, for which the number of increases and decreases reaches 1000 while operation instruction signal is supplied 1100 times, to have passed, and semiconductor devices, for which the number of increases and decreases has not reached 1000, to have failed. When the number of increases and decreases reaches 1000 for all semiconductor devices, the all devices are judged to have passed after which the supply of operation instruction signals is halted. If the number of increases and decreases is short of 1000 for even one device, the operation instruction signal continues to be supplied repeatedly to the devices in the lot; however, when the number of operation instruction signals supplied reaches 1100, the burn-in test for the lot ends.

Figure 3:
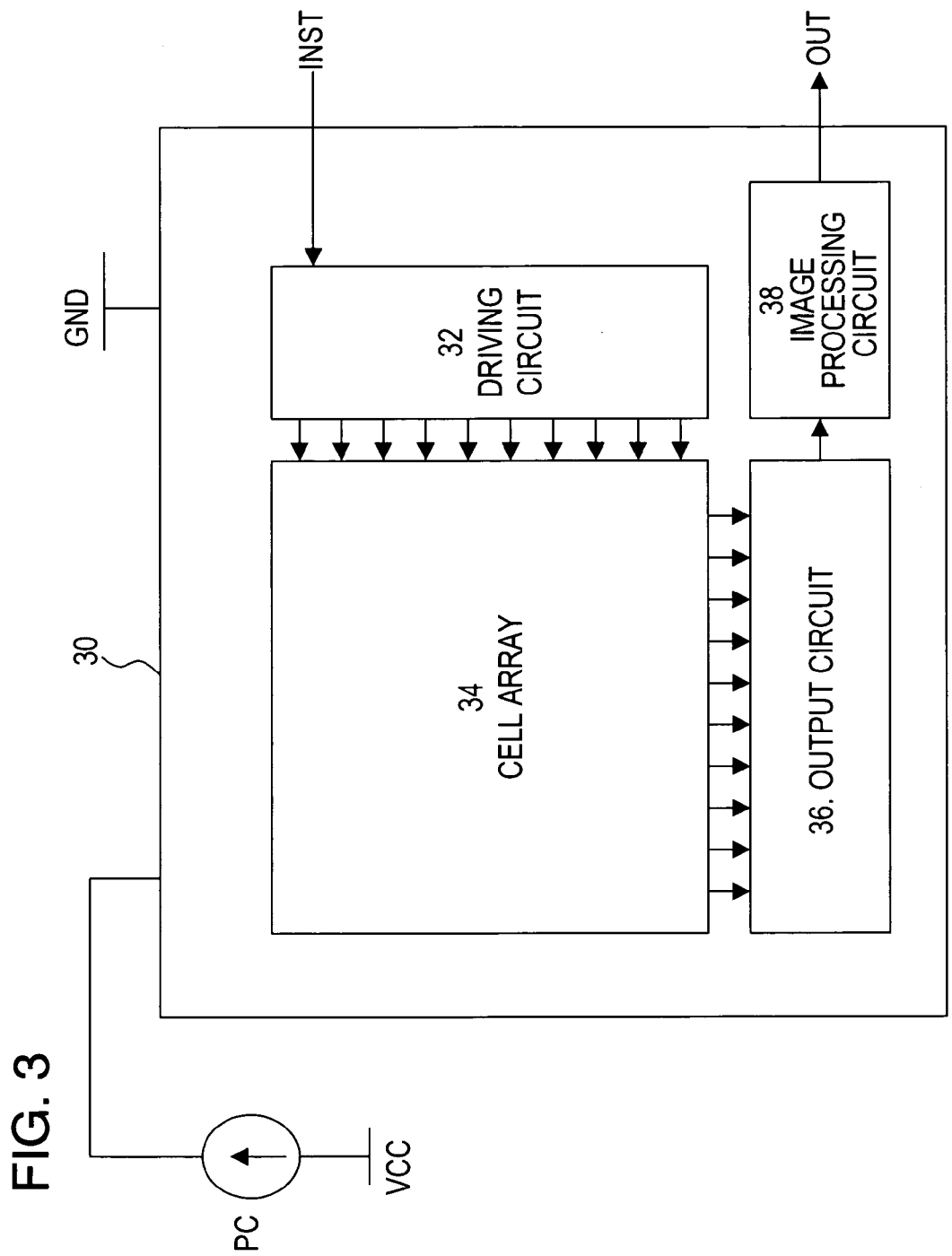
FIG. 3 shows the configuration of an image sensor which is one example of a semiconductor device to be tested.

FIG. 3 shows the configuration of an image sensor which is one example of a semiconductor device to be tested. This example is of for example a CMOS image sensor; the image sensor 30 has a cell array 34 having cells with photoelectric conversion elements in matrix form, a driving circuit 32 which supplies reset signals, scan signals and similar to the cell array 34, an output circuit 36 which detects signals read from each of the cells of the cell array, an image processing circuit 38 which performs image processing of signals detected by the output circuit and generates an image capture output signal, and similar. The image sensor 30 is connected to a power supply voltage Vcc and to a ground power supply GND. Further, current detection means PC to detect the power supply current of the power supply voltage source Vcc for burn-in testing is connected. This current detection means PC is comprised by the current monitoring portion 16 of FIG. 2, and detects increases and decreases in the power supply current as the current value detected by the current detection means PC rises above and falls below prescribed thresholds.

In the state in which a power supply Vcc is supplied, an image sensor is in a kind of standby state, and does not perform the expected operation. In this state, the power supply voltage is substantially zero, or only a very small current is consumed. When an image-capture instruction or other operation instruction signal INST is supplied, for example, cell reset, image-capture operation to perform photoelectric conversion, signal detection operation to read cell signals after the end of the image capture period, and image processing operation to process detected signals, are executed, and the image output OUT is output. That is, an operating state is entered over a prescribed period in response to the operation instruction signal INST. In this operating state, the internal circuitry operates and consumes a power supply current, so that the power supply current increases; when the operating state ends and the device returns to the standby state, the power supply current decreases. Hence by checking whether there is an increase and decrease in the power supply current in association with an operation instruction signal INST, it is possible to verify indirectly that normal operation has occurred.

Figure 4:
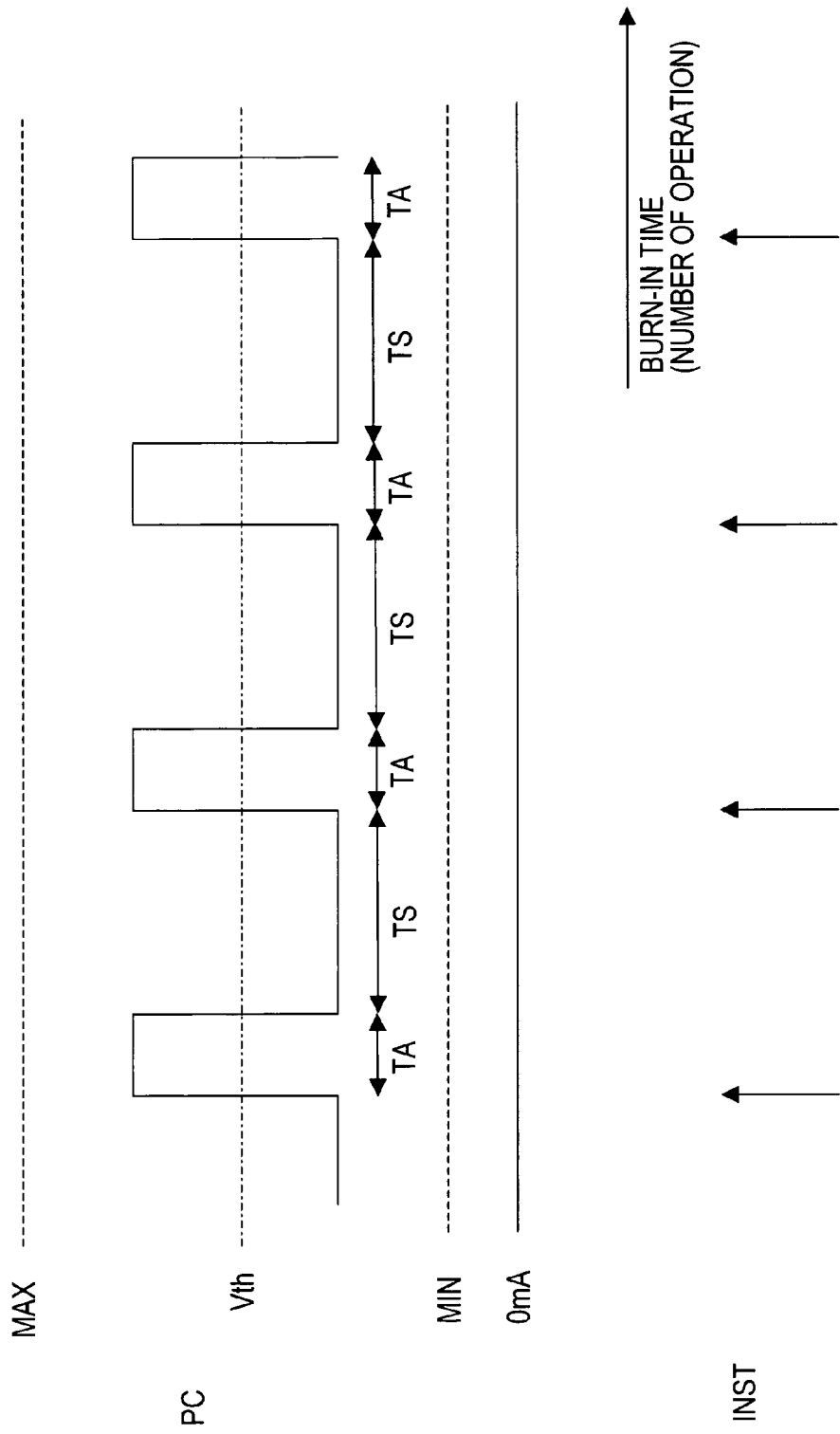
FIG. 4 explains a burn-in testing method in an embodiment.
Figure 5:
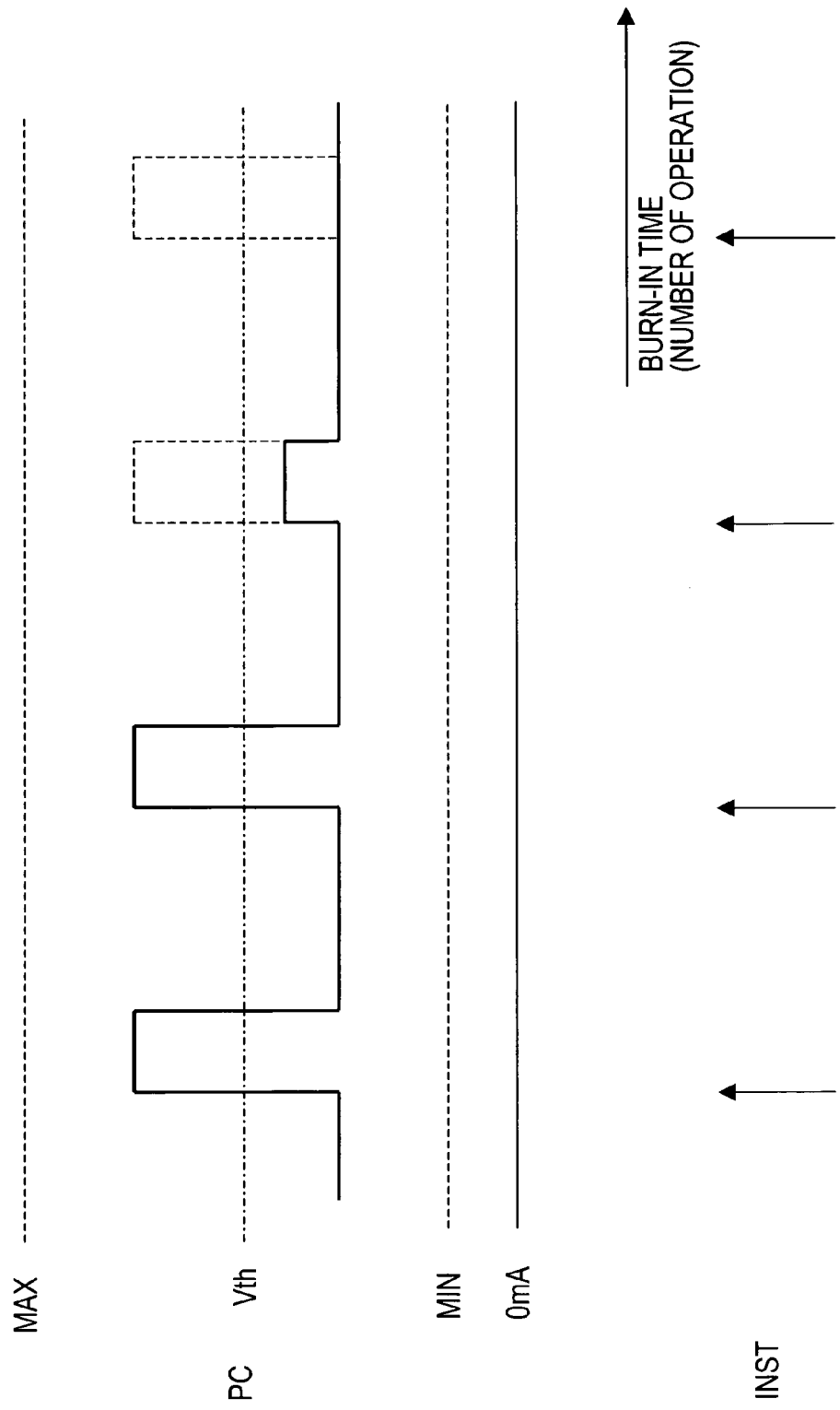
FIG. 5 explains a burn-in testing method in an embodiment.

FIG. 4 and FIG. 5 explain the burn-in testing method of the embodiment. The drawings show the timing with which operation instruction signals INST are supplied and the corresponding increase-decrease waveform of the power supply current PC. A minimum monitoring current value MIN higher than a current value of 0 and a maximum monitoring current value MAX, as well as a threshold value Vth to judge the increase and decrease of the power supply current, are set for the waveform of the power supply current PC. The current monitoring portion 16 of FIG. 2 monitors the current value of the power supply current PC between the minimum monitoring current value MIN and the maximum monitoring current value MAX, and detects when the current value rises above and falls below the threshold Vth.

When an operation instruction signal INST is supplied, the image sensor, which has been in the standby state, performs a series of image capture operations, and returns to the standby state. For example, an operation instruction signal INST is supplied repeatedly at two second intervals, such that an operating state TA of 0.5 second and standby state Ts 1.5 second long are repeated. If the device is non-defective, the image capture operation is executed in response to the operation instruction signals INST, and during these TA periods the power supply current increases. The example of FIG. 4 is a waveform of the power supply current PC for the case of a non-defective device; the power supply current increases and decreases corresponding to all the operation instruction signals INST. For example, in the standby state TS the power supply current may be 10 mA (per device), and the power supply current in the operating state TA may be 30 mA. This current value is an unique value for the device being tested.

On the other hand, the example of FIG. 5 is the power supply current waveform for a defective device. That is, the power supply current PC increases and decreases corresponding to the first two operation instruction signals INST, but there is no increase or decrease in the power supply current PC corresponding to the third and subsequent operation instruction signals INST. In other words, this is an example in which, as a result of accelerated operation through the first two operations, a defect emerged, so that infant mortality failure occurred.

Thus in burn-in testing, an image sensor which is the device to be tested is inserted into an atmosphere at a prescribed elevated temperature, and while supplying power, an operation instruction signal is supplied repeatedly to cause actual operation of the image sensor. Whether the device is operating normally can be verified through increases and decreases in the power supply current. By repeatedly supplying the operation instruction signal and counting the number of increases and decreases in the power supply current corresponding thereto, the device is judged to be non-defective if the number of increases and decreases, corresponding to normal operation, reaches a prescribed assurance number (a first number), and is judged to be defective if the prescribed assurance number is not reached, so that devices undergoing infant mortality failure can be excluded. By means of this method, there is no need to generate a complex input test pattern, nor is there a need to judge whether an output signal is defective or not, so that appropriate burn-in testing can be performed at low cost.

Figure 6:
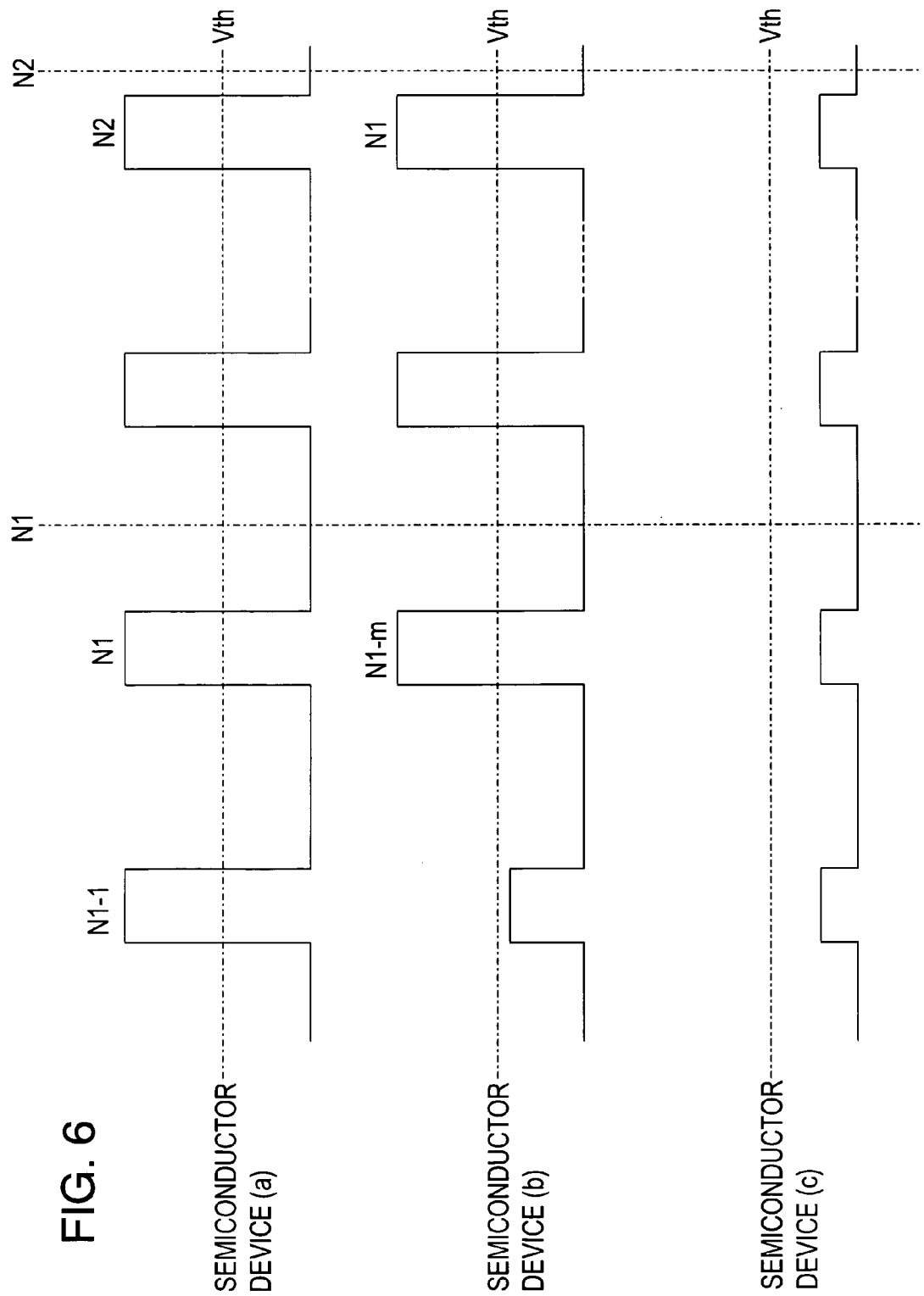
FIG. 6 explains a burn-in testing method in an embodiment.

FIG. 6 explains the burn-in testing method of this embodiment. In FIG. 6, power supply current waveforms are shown for three devices, (a), (b) and (c). Device (a) is a non-defective device for which increases and decreases in the power supply current occurred corresponding to all operation instruction signals; device (b) is a device in which, for some reason, increases and decreases in the power supply current randomly fail to occur; and device (c) is a defective device for which no increases or decreases in the power supply current occur. Here, the number of increases/decreases in the power supply current for the non-defective device (a) reaches N1 when the operation instruction signal is supplied N1 times. On the other hand, increases/decreases in the power supply current accidentally fail to occur in the case of the device (b), so that the number of increases/decreases does not reach N1. And, no increases or decreases in the power supply current occur in the case of the defective device (c).

In such a case, in the burn-in testing of this embodiment the operation instruction signal is repeatedly supplied a number of times exceeding N1 times. As a result, the number of increases/decreases in the power supply current of device (b) may reach N1 times, in which case the device (b) would be judged to be a non-defective device. However, if the operation instruction signal is supplied a limitless number of times, the burn-in testing itself is extended over a prolonged length of time, and so the upper limit to the number of times the operation instruction signal is supplied is set at N2 times (a second number); if the number of increases/decreases in the power supply current does not reach N1 even when the operation instruction signal is supplied the number of times of this upper limit, the device is judged to be defective. By this means, devices such as device (b) can be saved and judged as non-defective. As explained above, the operation instruction signal is supplied to all semiconductor devices simultaneously.

Figure 7:
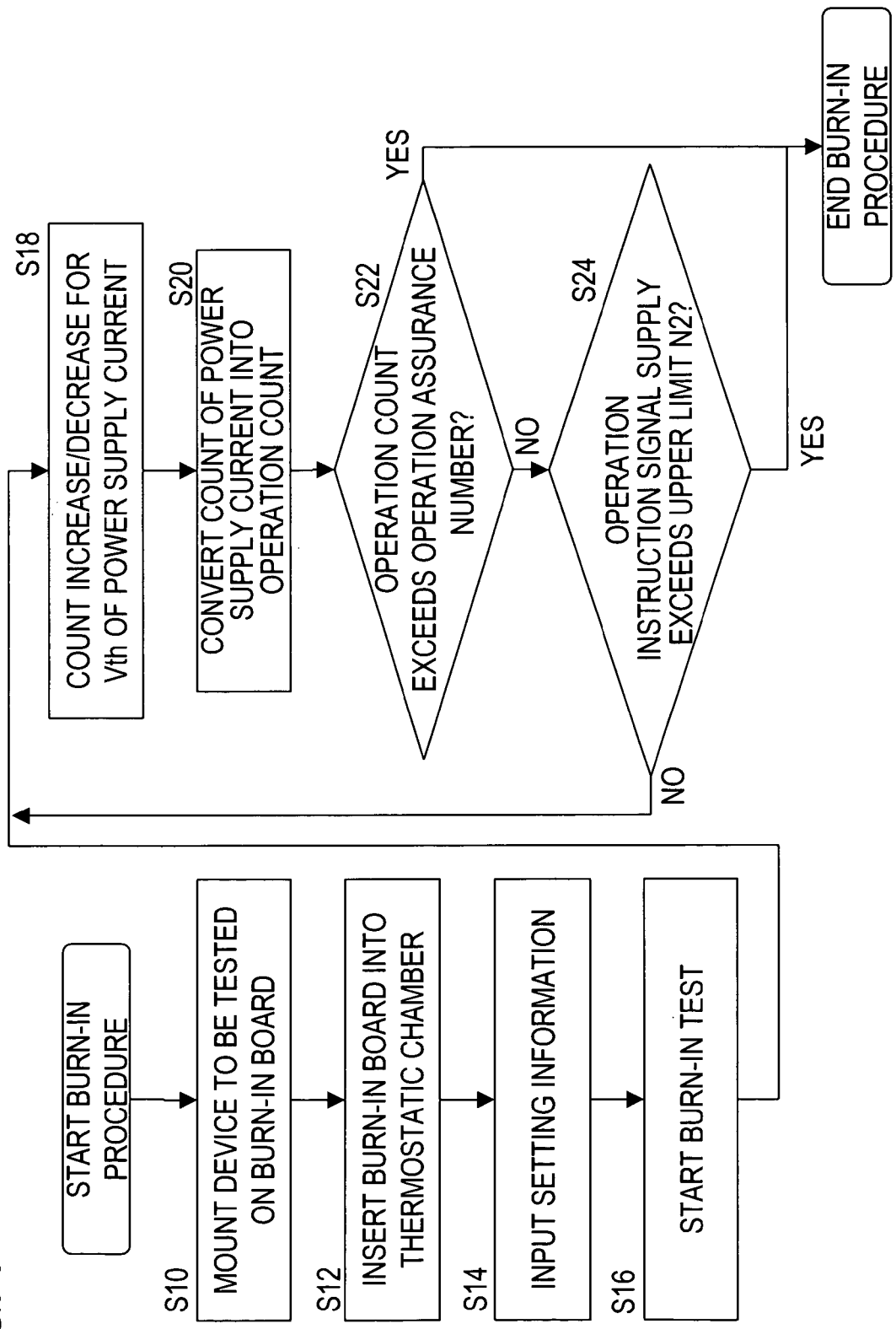
FIG. 7 is a flowchart of a burn-in testing method in an embodiment.

FIG. 7 is a flowchart of the burn-in testing method of this aspect. First, a device to be tested is mounted on a burn-in board (S10), and the burn-in board is inserted into a thermostatic chamber (S12). Setting information, such as the assurance number N1, the maximum number of times the operation instruction signal is supplied N2, and the threshold Vth for judgment of power supply current increases/decreases, are input to the burn-in testing control unit 20 (S14). Then, the burn-in test is started (S16). In this burn-in test, the interior of the thermostatic chamber is maintained in an elevated temperature state, and while supplying power to the devices to be tested, an operation instruction signal is supplied to the devices repeatedly, and corresponding increases/decreases in the power supply current are counted (S18). In counting power supply current increases/decreases, one increase/decrease is detected when the power supply current rises above and then falls below the threshold Vth.

The burn-in testing control unit 20 converts detection of an occurrence of the power supply current rising above and then falling below the threshold, from the power supply current monitoring portion 16, into one operation count (S20). For example, one pair of occurrences detecting the rise and the fall of the power supply current would be regarded as one operation. A check is then performed to determine whether the number of detected operations has exceeded the operation assurance number N1 (S22). If the number of operations exceeds the operation assurance number N1 for all the devices to be tested, then all devices are regarded as non-defective, and the burn-in test is ended. If the number of operations has not yet reached the operation assurance number N1 for a portion of the devices being tested, the supply of operation instruction signals is repeated until the upper limit N2 of the number of operation instruction signals is reached (S24); and devices for which the number of operations has reached the operation assurance number N1 until the upper limit N2 are judged to be non-defective devices, further devices for which the number of operations has not reached the operation assurance number N1 even at that time are judged to be defective devices.

It is preferable that operation instruction signals not be applied to tested devices for which the number of operations has already reached the operation assurance number N1; in this case, it is necessary to control the supply and halt of the operation instruction signals differently to devices being tested.

As described above, by repeatedly supplying an operation instruction signal at prescribed time intervals while supplying power in an elevated-temperature state, the device being tested can be repeatedly switched between the standby state and the operating state, and by counting the number of increases and decreases in the power supply current corresponding to the operation instruction signals, the device is judged to be non-defective if the operation assurance number N1 is reached, and defective, having undergone an infant mortality failure, if this number is not reached. And by setting the number of times the operation instruction signal is applied to a number N2 greater than N1, devices which normally would be considered non-defective, but which for some reason have resulted in detection of power supply current increases/decreases a fewer number of times, can be judged non-defective and saved for use.

Figure 8:
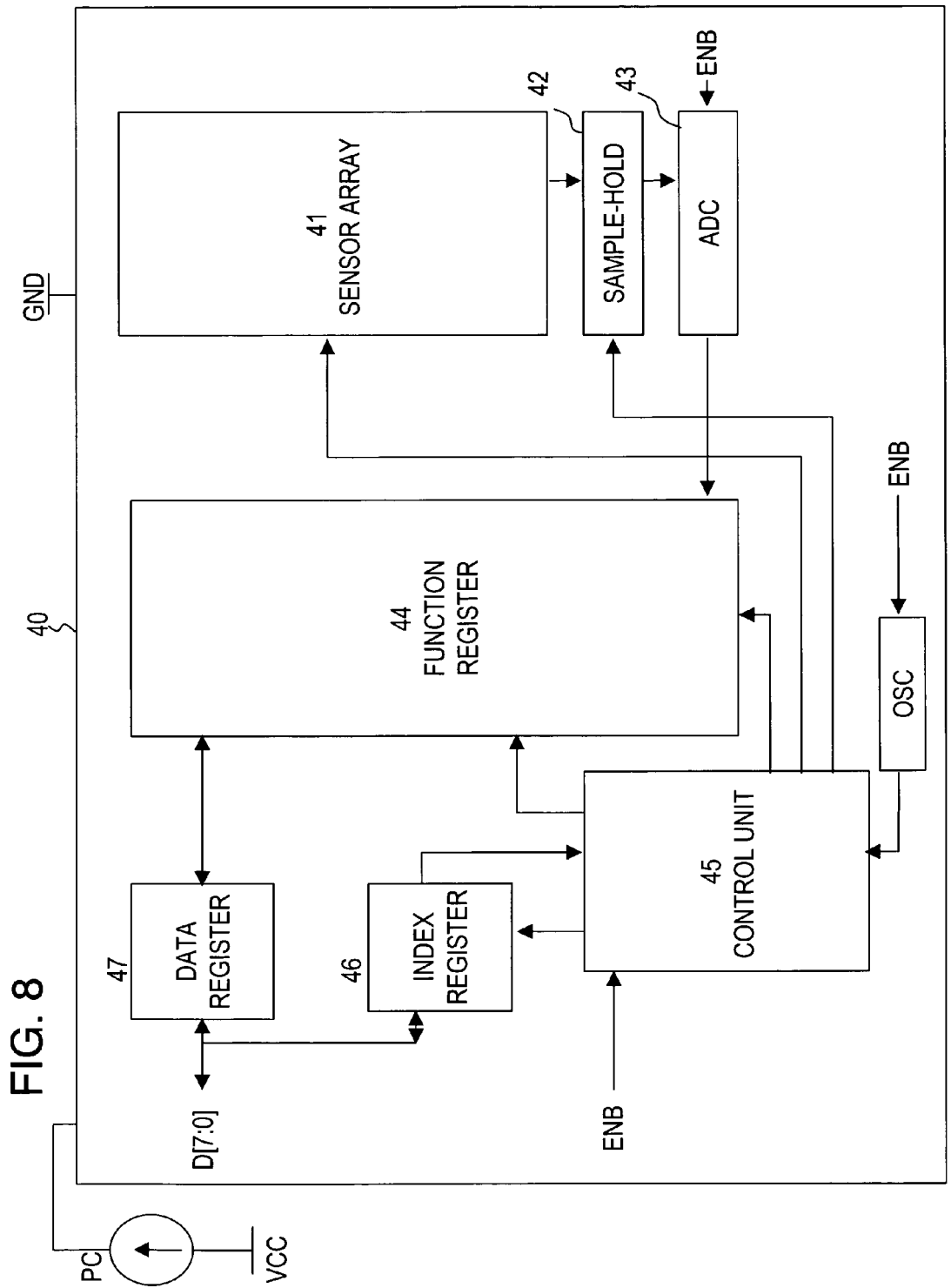
FIG. 8 shows the configuration of a fingerprint sensor which is one example of a semiconductor device for testing; and, FIG. 9 shows the configuration of a device for testing other than an image sensor or a fingerprint sensor.

FIG. 8 shows the configuration of a fingerprint sensor which is one example of a semiconductor device for testing. When a fingerprint, which is the object for inspection, is pressed against the sensor array 41, the fingerprint sensor 40 detects and outputs, as electrical signals, differences in the accumulated charge in cells corresponding to the protrusions and depressions of the fingerprint. That is, in the normal state there is no detection of a fingerprint pattern by the sensor array, and the fingerprint pattern detection operation is performed only when a fingerprint is pressed against the sensor array.

The fingerprint sensor 40 shown in FIG. 8 has a sensor array 41 which detects fingerprint depressions and protrusions, a sample-hold circuit 42 which detects cell signals of the sensor array 41, and an AD conversion portion 43 which converts the detected analog signals into digital signals. In addition, the device 40 has an 8-bit data input/output terminal D, a data register 47, an index register 46, a control unit 45, a function register 44, and an oscillator OSC. The fingerprint sensor has various operating modes; these operating modes are registered in the function register 44. That is, a command supplied to the data input/output terminal D is input to the index register 46 in response to an enable signal ENB, and is registered in the function register 44. Operating modes may be, for example, a normal operating mode in which the device operates only when a fingerprint is pressed against the device, a power-down mode for an energy-conserving state, and similar. Operating modes also comprise a pseudo-operating mode in which a sensor array signal is detected and output even when no fingerprint is pressed against the device.

When set to the normal operating mode, in response to the pressing of a fingerprint against the sensor array 41, cell signals of the sensor array 41 pass through the sample-hold circuit 42, AD converter 43, function register 44, and data register 47 to be output from the data input/output terminal D. And when set to the pseudo-operating mode, sensor array cell signals are similarly output. When set to power-down mode, the device is put into an energy-conserving state.

Burn-in tests of the above-described fingerprint sensor are performed as follows. In the case of a fingerprint sensor, in normal operating mode detection operation is not executed if a fingerprint is not pressed against the sensor array, and so while supplying power, switching between the above-described pseudo-operating mode and the power-down mode is repeated. When set to pseudo-operating mode, a pseudo-operating mode command is applied to the data input/output terminal D, and an enable signal ENB is also applied. By this means the pseudo-operating mode is set, and pseudo-detection operation is executed even without pressing a fingerprint against the sensor array. Then, the pattern-down mode command is applied to the data input/output terminal D, and in addition the enable signal ENB is applied. By this means the device is put into the power conserving state.

By repeatedly switching between pseudo-operating mode and power-down mode as described above while monitoring the power supply current PC, operation to an operation assurance number can be confirmed, similarly to the case of an image sensor.

Figure 9:
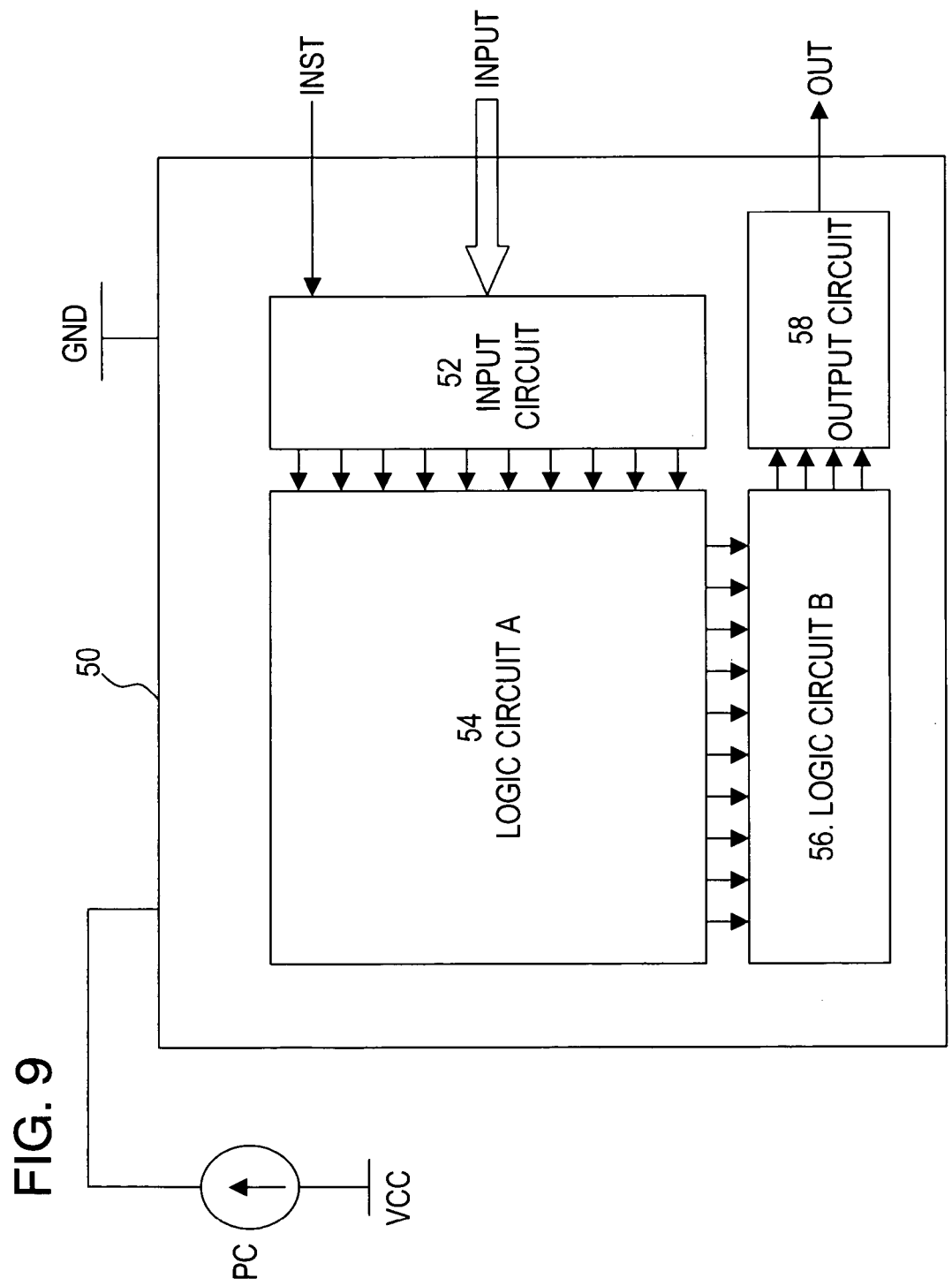

FIG. 9 shows the configuration of a device for testing other than an image sensor or a fingerprint sensor. Like an image sensor or fingerprint sensor, this device for testing also is in a standby state and does not operate even when power Vcc is applied, but performs an operation upon receiving supply of an operation instruction signal INST. Such a device for testing 50 has an input circuit 52, logic circuits 54 and 56, and an output circuit 58; when an operation instruction signal INST is supplied to the input circuit 52, the input pattern INPUT is captured and is transferred to the logic circuit 54. Prescribed logic operations are then executed by the logic circuits 54 and 56, and the operation results are output by the output circuit 58. In this way, if the device for testing remains in the standby state even if connected to a power supply Vcc, but executes a prescribed internal operation upon being supplied with an operation instruction signal INST, and upon completing the operation returns once again to the standby state, then the above-described burn-in testing method can be employed effectively. Tests such as those of the prior art in which an input test pattern is supplied to an input terminal INPUT for testing, and the corresponding output OUT is checked for coincidence with an expected output pattern, incur high testing costs, and may not be practical. On the other hand, the above-described burn-in testing method involves simple processes and can be used to hold down testing costs.

What is claimed is:

1. A testing method of performing testing of a semiconductor device by causing an operation in an atmosphere at a prescribed temperature, comprising:
   repeatedly supplying an operation instruction signal instructing the operation to said semiconductor device while applying a power supply to said semiconductor device; and
   counting increases and decreases in the power supply current corresponding to said operation instruction signals.

2. The testing method according to claim 1, wherein said semiconductor device includes an image sensor which performs an image-capture operation in response to said operation instruction signal while power is being supplied.

3. The testing method according to claim 2, wherein said operation instruction signal is an image-capture instruction signal.

4. The testing method according to claim 1, wherein said semiconductor device includes a fingerprint sensor which performs a fingerprint shape recognition operation in response to the operation instruction signal while power is being supplied.

5. The testing method according to claim 4, wherein said operation instruction signal is a signal specifying a pseudo-operating mode in which a fingerprint shape recognition operation is performed even when no fingerprint is pressed against the device.

6. The testing method according to claim 1, wherein said semiconductor device enters a standby state without performing an expected operation while power is being supplied, and enters an operating state and executes the expected operation in response to an operation instruction.

7. The testing method according to claim 1, wherein, when the number of increases and decreases of the power supply current corresponding to said operation instruction signals reaches a first number of times, the device is judged to be non-defective, and when said first number of times is not reached, the device is judged to be defective.

8. The testing method according to claim 7, wherein supply of said operation instruction signal is repeated until a second number of times, which is greater than said first number of times, is reached.

* * * * *